(12) United States Patent
Geiss (10) Patent No.: US 10,320,376 B2
(45) Date of Patent: Jun. 11, 2019

(54) FREQUENCY DIVIDER WITH SELECTABLE FREQUENCY AND DUTY CYCLE

(71) Applicant: Integrated Device Technologies, Inc., San Jose, CA (US)

(72) Inventor: Richard Geiss, Kanata (CA)

(73) Assignee: Integrated Device Technology, Inc., San Jose, CA (US)

( * ) Notice: Subject to any disclaimer, the term of this patent is extended or adjusted under 35 U.S.C. 154(b) by 52 days.

(21) Appl. No.: 15/347,050

(22) Filed: Nov. 9, 2016

(65) Prior Publication Data

US 2018/0131357 A1 May 10, 2018

(51) Int. Cl.
*H03K 21/02* (2006.01)
*H03K 5/156* (2006.01)

(52) U.S. Cl.
CPC ......... *H03K 5/1565* (2013.01); *H03K 21/026* (2013.01)

(58) Field of Classification Search
CPC ... H03K 5/1565; H03K 21/026; H03L 7/0992
USPC ....................................................... 327/115
See application file for complete search history.

(56) References Cited

U.S. PATENT DOCUMENTS

| | | | |
|---|---|---|---|
| 4,170,747 A | 10/1979 | Holmes | |
| 4,403,342 A | 9/1983 | Borras et al. | |
| 4,935,944 A | 6/1990 | Everett | |
| 5,384,816 A | 1/1995 | Prysby et al. | |
| 6,061,418 A | 5/2000 | Hassoun | |
| 7,102,391 B1* | 9/2006 | Sun | G01K 7/015 327/10 |
| 8,378,719 B1* | 2/2013 | Pace | H03K 23/66 327/115 |
| 9,490,828 B1 | 11/2016 | Gao | |
| 2007/0001998 A1 | 1/2007 | Smith et al. | |
| 2007/0139088 A1 | 6/2007 | Garlapati et al. | |
| 2007/0262826 A1 | 11/2007 | Dowlatabadi et al. | |
| 2008/0309416 A1 | 12/2008 | Kaneko et al. | |
| 2008/0309420 A1* | 12/2008 | Fu | H03K 23/667 331/1 A |
| 2009/0168947 A1 | 7/2009 | Chiu et al. | |
| 2010/0164562 A1 | 7/2010 | Tseng et al. | |

(Continued)

OTHER PUBLICATIONS

International Search Report issued by ISR/US for PCT/US2017/053551, (dated Jan. 22, 2018) pp. 1-5.

(Continued)

*Primary Examiner* — Patrick C Chen
(74) *Attorney, Agent, or Firm* — Haynes and Boone, LLP (57) ABSTRACT

A frequency divider system and method includes a split-divisor frequency divider module. The split-divisor frequency divider module receives a clock signal and generates an output signal based on a first divisor and a second divisor. The clock signal and output signal each have rectangular waveforms characterized by a respective frequency and pulse width. The frequency of the output signal is a selectable integer fraction of the frequency of the clock signal, the frequency of the output signal being selected based on a sum of the first and second divisors. The pulse width of the output signal is a selectable integer number of clock cycles, the pulse width of the output signal being selected based on at least one of the first divisor and the second divisor.

13 Claims, 7 Drawing Sheets

(56) References Cited

U.S. PATENT DOCUMENTS

| | | |
|---|---|---|
| 2014/0003570 A1* | 1/2014 | Terrovitis ............. H03K 23/002 |
| | | 377/48 |
| 2014/0185736 A1 | 7/2014 | Chandrashekar et al. |
| 2015/0263709 A1 | 9/2015 | Luedeke et al. |

OTHER PUBLICATIONS

Written Opinion of the the International Searching Authority, issued by ISR/US for PCT/US2017/053551, (dated Jan. 22, 2018) pp. 1-8.

* cited by examiner

FREQUENCY DIVIDER WITH SELECTABLE FREQUENCY AND DUTY CYCLE

TECHNICAL FIELD

The present disclosure relates generally to frequency divider systems and more particularly to frequency divider systems with a selectable frequency and duty cycle.

BACKGROUND

Electronic data communication is a fundamental capability of modern information processing technologies. Data is encoded into electrical signals using a variety of techniques. Some techniques involve modulating one or more characteristics of a periodic waveform, such as the frequency, amplitude, duty cycle, and/or the like. In this manner, information may be reliably transmitted locally on a chip, between chips in a package, between devices on a circuit board, and/or over long distances (e.g., on a transmission line). In some systems, an encoded electrical signal is modulated for transmission at high frequencies (e.g., radio frequencies and/or optical frequencies) for applications such as wireless communication.

Frequency dividers modify a periodic clock signal by generating a voltage pulse or otherwise changing state ever N clock cycles, where N is an integer value. In this manner, the frequency of an output signal generated by a frequency divider is 1/N times the frequency of the original clock signal. Frequency dividers are used in a variety of applications. For example, frequency dividers may be used to supply clock signals to multiple devices or multiple areas within a device operate at different clock frequencies, to reduce clock frequency for improved energy efficiency, and/or the like.

Accordingly, it would be desirable to provide improved frequency divider systems for data communication applications.

SUMMARY

Consistent with some embodiments, a frequency divider system includes a split-divisor frequency divider module. The split-divisor frequency divider module receives a clock signal and generates an output signal based on a first divisor and a second divisor. The clock signal and output signal each have rectangular waveforms characterized by a respective frequency and a pulse width. The frequency of the output signal is a selectable integer fraction of the frequency of the clock signal, the frequency of the output signal being selected based on a sum of the first and second divisors. The pulse width of the output signal is a selectable integer number of clock cycles, the pulse width of the output signal being selected based on at least one of the first divisor and the second divisor.

Consistent with some embodiments an encoder includes a processor that determines one or more control signals based on input data, and a frequency divider that generates an output signal based on the one or more control signals. The input data is encoded into the output signal by varying at least one of a frequency and a duty cycle of the output signal. The frequency of the output signal is an integer fraction of a frequency of a clock signal.

Consistent with some embodiments, a method includes receiving a clock signal, receiving a first divisor N0 and a second divisor N1; and generating an output signal. The output signal has a frequency given by 1/(N0+N1) times a frequency of the clock signal and a duty cycle given by N0/(N0+N1) or N1/(N0+N1).

BRIEF DESCRIPTION OF THE DRAWINGS

In the figures, elements having the same designations have the same or similar functions.

DETAILED DESCRIPTION

In the following description, specific details are set forth describing some embodiments consistent with the present disclosure. It will be apparent to one skilled in the art, however, that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

In general, frequency dividers tend to offer limited flexibility in terms of the characteristics of the output signals that they generate. For example, some frequency dividers generate a pulse every N clock cycles, where each pules has a width, of one clock cycle. Accordingly, the duty cycle of the output signal is constrained to 1/N. Other types of frequency dividers may achieve a duty cycle that is fixed (e.g., 50%) for all frequencies. Accordingly, such frequency dividers are not well suited for applications in which a flexible, selectable duty cycle is desired for a given frequency. Moreover, some frequency dividers are limited in terms of the maximum frequency of the output signal that they can achieve. For example, the maximum frequency of some frequency dividers is ½ or ¼ times the frequency of a clock signal. Other types of frequency dividers are limited in teens of the achievable frequencies. For example, some types of frequency dividers with a 50% duty cycle may require N to be even. Accordingly, it would be desirable to provide a frequency divider with a selectable frequency and duty cycle. It would further be desirable to provide a frequency divider that achieves a flexible duty cycle without placing constraints on the available frequencies (e.g., without constraining the frequency divider to even values of N). Finally, it would be desirable to provide a frequency divider capable of providing a high frequency output signal (e.g., 1, ½, and/or ⅓ times the clock frequency). A frequency divider that achieves one or more of these desirable characteristics may offer improved performance relative to other types of frequency dividers in applications such as encoders for data communication.

Figure 1:
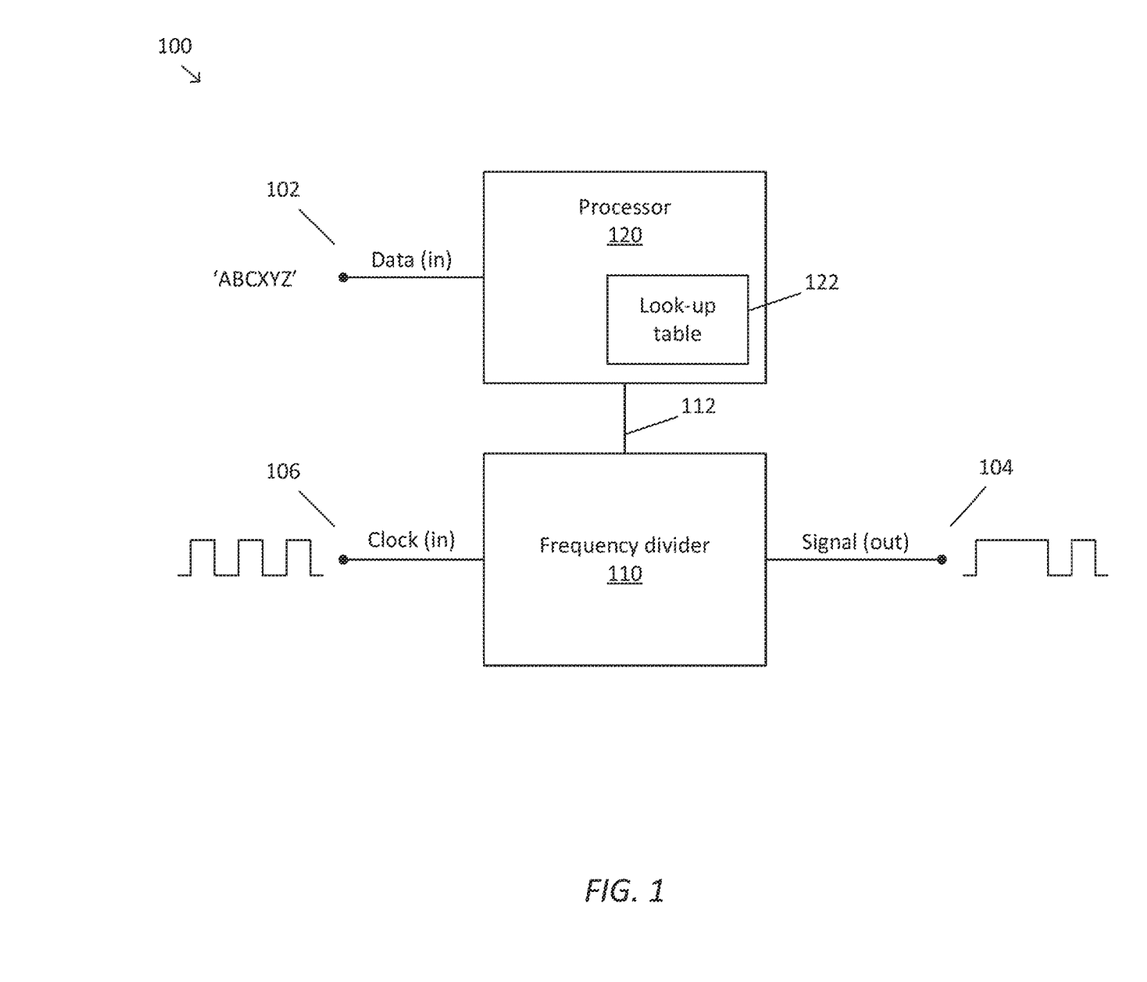
FIG. 1 is a simplified diagram of an encoder according to some embodiments.

FIG. 1 is a simplified diagram of an encoder 100 according to some embodiments. Encoder 100 encodes input data 102 into an output signal 104. Input data 102 may include an analog and/or digital, representation of virtually any type of data. For example, input data 102 may include alphanumeric data, binary data, image data, video data, audio data, control data, and/or the like. Output signal 104 may be a rectangular waveform characterized by an amplitude, a frequency, and a pulse width (or duty cycle). Input data 102 is encoded in output signal 104 by varying one or more of the amplitude, frequency, and/or the pulse width of output signal 104. Although output signal 104 is depicted as a fixed-amplitude rectangular waveform, it is to be understood that similar concepts may be applied to other types of output signals (e.g., variable-amplitude signals, multi-level signals, modulated signals (e.g., radio frequency and/or optical signals), and/or the like).

A frequency divider 110 with a selectable frequency and duty cycle generates output waveform 104 based on a clock signal 106. In some examples, clock signal 106 may be a square waveform with a fixed amplitude and frequency and a 50% duty cycle. Frequency divider 110 divides the frequency of clock signal 106 by an integer value to generate output waveform 104 (i.e., the frequency of output waveform 104 is 1/N times the frequency of clock signal 106, where the divisor N is a positive integer). In some examples, the value of divisor N may be subject to one or more constraints (e.g., a maximum and/or minimum value). For example, divisor N may be constrained to values greater than or equal to 2 or 4, depending on the configuration of frequency divider 110.

According to some embodiments, frequency divider 110 may be operated in a fixed-duty-cycle mode, in which the duty cycle of output signal 104 is fixed and the frequency is variable. According to some embodiments, frequency divider 110 may be operated in a fixed-frequency mode, in which the frequency of output signal 104 is fixed and the duty cycle is variable. According to some embodiments, frequency divider 110 may be operated in a hybrid mode, in which both the frequency and duty cycle of output signal 104 are variable. Frequency divider 110 determines the frequency (i.e., the value of divisor N) and/or the duty cycle of output waveform 110 based on one or more control signals 112.

A processor 120 generates control signals 112 based on input data 102. In some examples, processor 120 may include a look-up table 122 for mapping input data 102 to corresponding values for control signals 112. In some examples, processor 110 may perform one or more operations on input data 102 to enhance the speed, reliability, and/or security of encoder 100. For example, processor 120 may perform source coding, channel coding, encryption, whitening, compression, and/or the like on input data 102. In some examples, processor 120 may multiplex a plurality of input data streams (e.g., using time division multiplexing, queuing algorithms, and/or the like).

Figure 2:
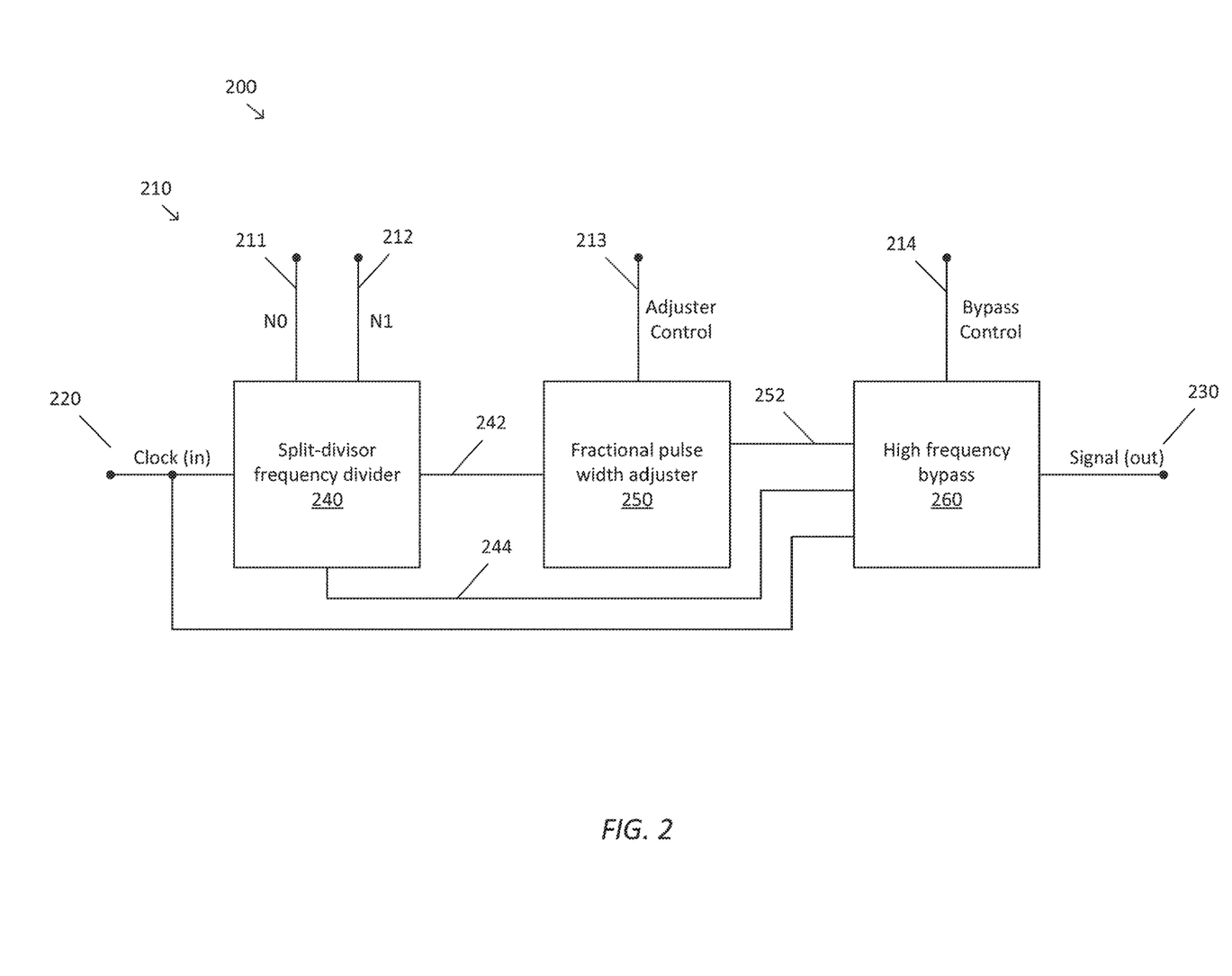
FIG. 2 is a simplified diagram of a frequency divider with a selectable frequency and duty cycle according to some embodiments.

FIG. 2 is a simplified diagram of a frequency divider 200 with a selectable frequency and duty cycle according to some embodiments. According to some embodiments consistent with FIG. 1, frequency divider 200 may be used to implement frequency divider 120 of encoder 100. Consistent with such embodiments, control signals 210, clock signal 220, and output signal 230 may generally correspond to control signals 112, clock signal 106, and output signal 104, respectively. However, in some examples frequency divider 200 may be used for applications independent of encoder 100 (e.g., for applications other than encoding information for data communication). For example, frequency divider 200 may be used to provide a configurable and/or dynamically selectable clock waveform for computing applications.

A split-divisor frequency divider 240 divides the frequency of clock signal 220 based on a first divisor 211 (N0) and a second divisor 212 (N1). Split-divisor frequency divider 240 generates a divider output signal 242 characterized by a frequency and duty cycle. The frequency and duty cycle of divider output signal 242 are each selectable based on the values of N0 and N1. According to some embodiments, divider output signal 242 may have a frequency given by $$\frac{(\text{Clock Frequency})}{N0+N1}$$

and a duty cycle given by $$\frac{N1}{N0+N1}$$

Advantageously, the duty cycle at a given frequency is determined by the ratio N0:N1 and is therefore selectable by varying the values of divisors 211 and 212. By contrast, other types of frequency dividers that have a single divisor N may either have a fixed duty cycle for a given frequency or may rely on additional circuitry (e.g., multi-bit counters) to adjust the duty cycle, adding to the cost and complexity of the system. According to some embodiments, split-divisor frequency divisor 240 may generate one or more additional output signals, such as an untoggled output signal 244 that is discussed in greater detail below with reference to FIG. 3.

According to some embodiments, the pulse width of divider output signal 242 may be constrained to integer multiples of the clock cycle. For example, when the duty cycle of divider output signal 242 is given by $$\frac{N1}{N0+N1},$$

the corresponding pulse width of divider output signal 242 is given by N0 times the clock cycle, where N0 is an integer value. When the sum of N0 and N1 is an odd number, there is no value of N0 that results in a 50% duty cycle. However, in some applications, a 50% duty cycle may be desired even when the sum of N0 and N1 is odd.

To address these constraints, a fractional pulse width adjuster 250 may be used to adjust the pulse width of divider output signal 242 by a fraction of a clock cycle. In some examples, fractional pulse width adjuster 250 may be capable of adjusting (e.g., lengthening or shortening) the pulse width by half of a clock cycle such that a 50% duty cycle is achievable for any combination of N0 and N1 (including combinations in which the sum of N0 and N1 is an odd number). In some examples, fractional pulse width adjuster 250 may be capable of adjusting the pulse width by an arbitrary fraction of the clock cycle such that the duty cycle of output signal 230 is selectable within a continuous range. As depicted in FIG. 2, fractional pulse width adjuster 250 is controlled by an adjuster control signal 213. Adjuster control signal 213 may include a Boolean enable/disable signal, a numerical value to indicate a desired fractional adjustment, a polarity indicator to control whether the pulse width is lengthened or shortened, and/or the like.

According to some embodiments, the frequency of divider output signal 242 may be subject to a maximum frequency constraint. For example, according to some embodiments, the values of N0 and N1 may each be constrained to values greater than or equal to 2. Consistent with such embodiments, the maximum frequency of divider output signal 242 may be ¼ times the frequency of clock signal 220. However, in some applications, higher frequencies (e.g., 1/1, ½, and/or ⅓ times the frequency of clock signal 220) may be desired.

To address this constraint, a high frequency bypass module 260 may be used to bypass one or more stages of frequency divider 200 to provide a higher frequency waveform than the maximum frequency of split-divisor frequency divider 240. For example, high frequency bypass module 260 may pass clock signal 220 directly to output signal 230 to achieve a divisor of 1. In another example, high frequency bypass module 260 may pass untoggled output signal 244 to output signal 230 and/or to fractional pulse width adjuster 250 to achieve a divisor of 2 or 3. According to some embodiments, high frequency bypass module 260 may be implemented using one or more bypass circuits switches, selectors, multiplexors, and/or the like. As depicted in FIG. 2, high frequency bypass module 260 is controlled by a bypass control signal 214. Bypass control signal 214 may include one or more binary signals to enable or disable One or more bypass control signals 214 are used to determine whether divide-by-one bypass module 250 is enabled. For example, bypass control signals 214 may include a Boolean enable/disable signal.

Figure 3:
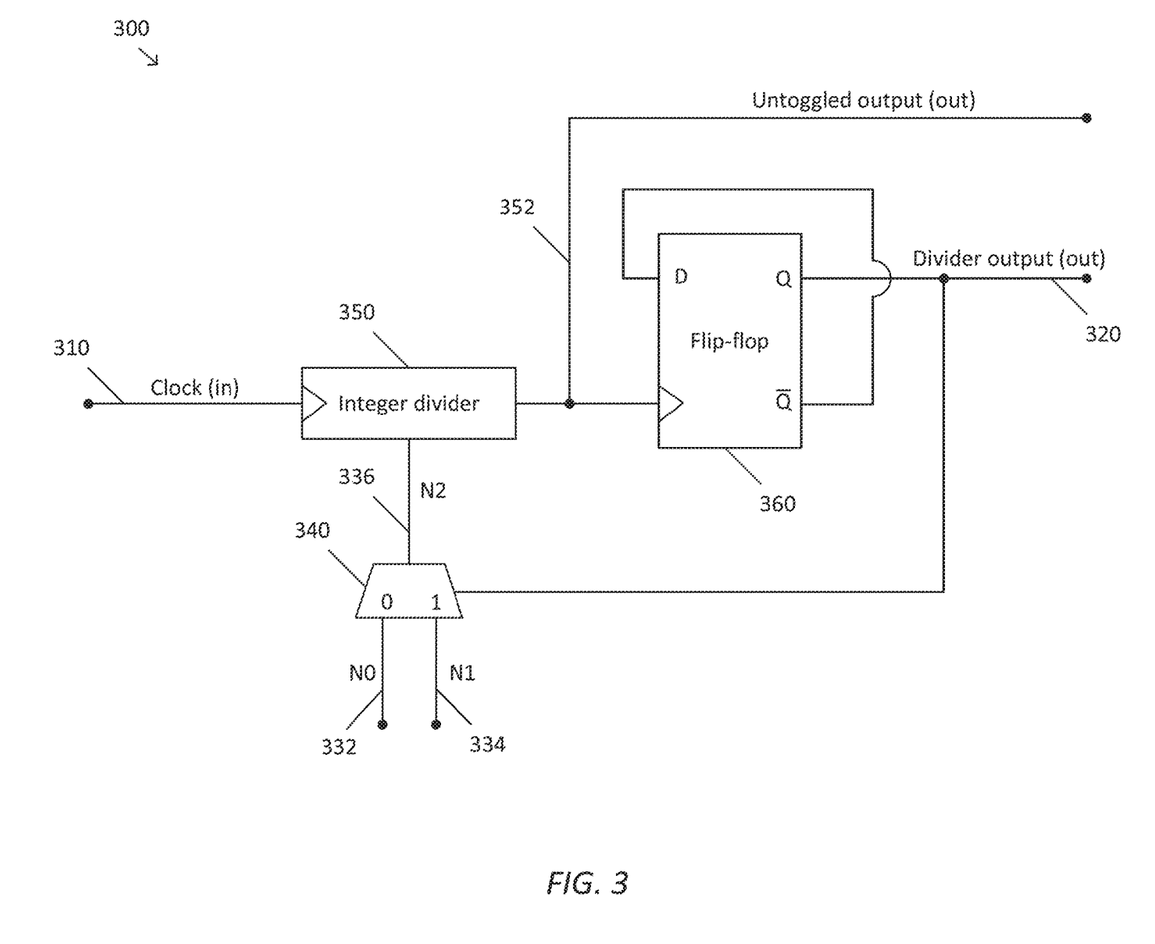
FIG. 3 is a simplified diagram of a split-divisor frequency divider according to some embodiments.

FIG. 3 is a simplified diagram of a split-divisor frequency divider 300 according to some embodiments. According to some embodiments consistent with FIGS. 1-2, split-divisor frequency divider may be used to implement frequency divider 110 of encoder 100 and/or split-divisor frequency divider 240 of frequency divider 200. Consistent with such embodiments, a clock signal 310, a divider output signal 320, a first divisor 332 (N0), and a second divisor 334 (N1) may generally correspond to clock signal 220, divider output signal 242, first divisor 211, and second divisor 212, respectively.

A multiplexer 340 selects between first divisor 332 and second divisor 334, using divider output signal 320 as a control input. A divisor 336 (N2) is set to the value of the selected one of first divisor 332 and second divisor 334. When divider output signal 320 is low, the value of divisor 336 is set to the value of first divisor 332 (i.e., N=N0). When divider output signal 320 is high, the value of divisor 336 is set to the value of second divisor 334 (i.e., N=N1). As discussed previously, N0, N1, and N2 are integer values and, may be represented in a suitable analog and/or digital format. N0, N1, and N2 may be each transmitted serially on a single wire, in parallel on a plurality of wires, and/or a combination thereof.

An integer divider 350 divides the clock frequency by N2 to generate an untoggled output signal 352 with a frequency of 1/N2 times the frequency of clock signal 310. In general, integer divider 350 may include any circuit or counter that changes its state or generates a pulse every N2 clock cycles. According to some embodiments, untoggled output signal may have a pulse width of one clock cycle, which corresponds to a duty cycle of 1/N2. That is, every N2 clock cycles, integer divider 350 generates a pulse that has a width of one clock cycle. Consistent with such embodiments, the minimum value of N2 may be 2, as setting N2 to 1 would cause untoggled output signal 352 to have a 100% duty cycle.

A flip-flop 360 receives untoggled output signal 352 and generates divider output signal 320. Flip-flop 360 is configured to toggle the value of divider output signal 320 at each low-to-high transition of untoggled output signal 352. As depicted in FIG. 3, flip-flop 360 is configured as toggle flip-flop, such as a D flip-flop in which the $\overline{Q}$, output node is coupled to the D input node to achieve toggling behavior. According to some embodiments, other types of flip-flops (e.g., a T flip-flop) and/or other circuit topologies that alternate logical state based on an input signal may be used to achieve similar or the same toggling behavior.

In the arrangement depicted in FIG. 3, untoggled output signal 352 undergoes a low-to-high transition every N0 clock cycles when divider output signal 320 is high and every N1 clock cycles when divider output signal 320 is low. Accordingly, divider output signal 320 is high for N0 clock signals and low for N1 clock cycles. That is, the period one full cycle of divider output signal 320 is N0+N1 clock cycles and the pulse width is N1 clock cycles. This corresponds to a frequency of $$\frac{\text{(Clock Frequency)}}{N0+N1}$$

and a duty cycle of $$\frac{N1}{N0+N1}.$$

Because N0 and N1 are each constrained to be greater than or equal to 2, the maximum frequency of divider output signal 320 is ¼ times the frequency of clock signal 310.

According to some embodiments, one or more signals may be inverted relative to the above discussion. For example, integer divider 350 may load the next value of N2 before generating a pulse rather than loading next value of N2 after generating a pulse, which would cause divider output signal 320 to be high for N0 clock signals and low for N1 clock cycles. Thus, in some embodiments, the duty cycle of divider output signal 320 may be given by $$\frac{N0}{N0+N1}$$

rather than $$\frac{N1}{N0+N1}.$$

Figure 4:
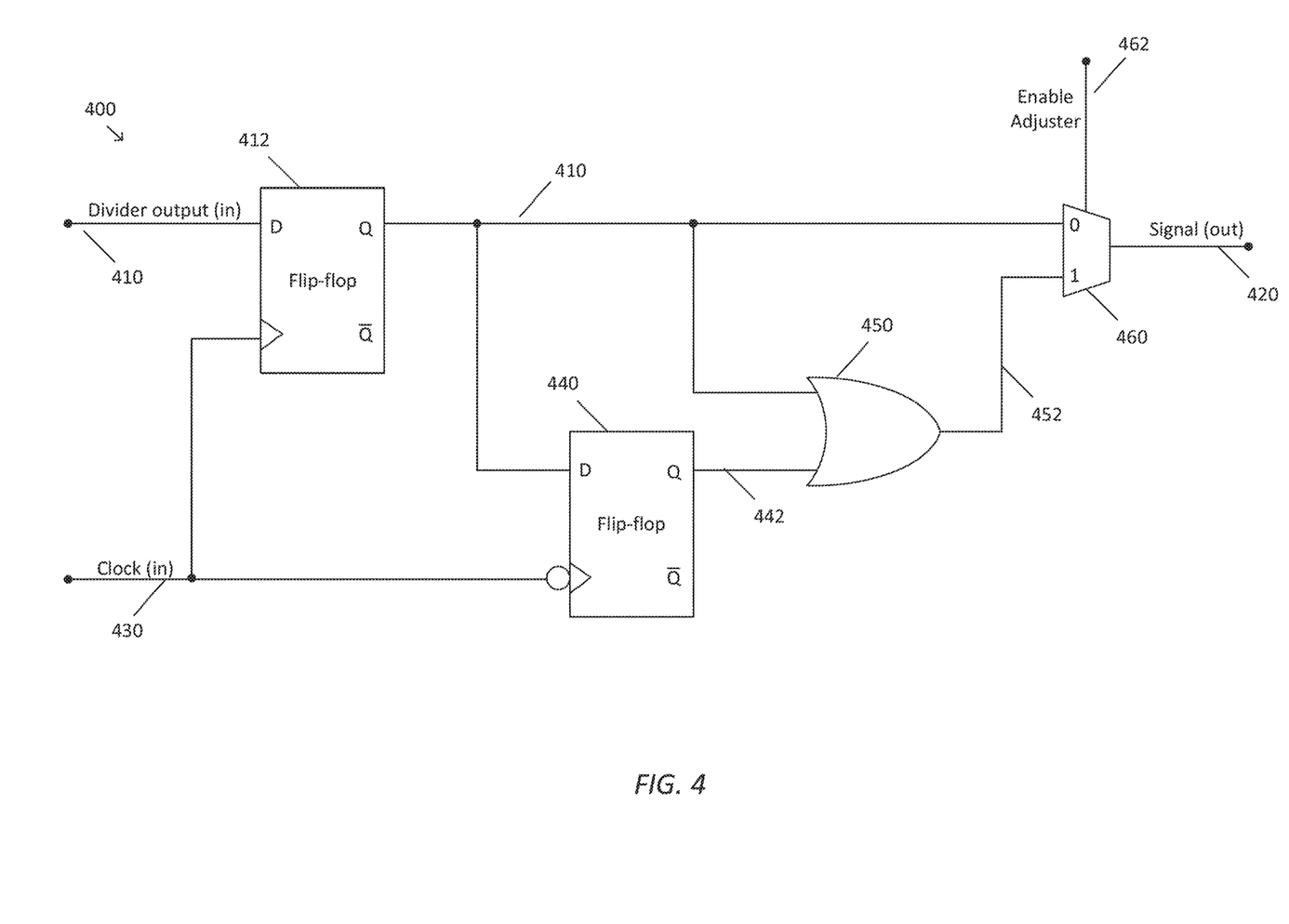
FIG. 4 is a simplified diagram of a fractional pulse width adjuster according to some embodiments.

FIG. 4 is a simplified diagram of a fractional pulse width adjuster 400 according to some embodiments. According to some embodiments consistent with FIGS. 1-3, fractional pulse width adjuster 400 may be used to implement fractional pulse width adjuster 250 of frequency divider 200. Consistent with such embodiments, divider output signal 410, output signal 420, and clock signal 430 may general correspond to divider output signal 242, output signal 230, and clock signal 220, respectively. Optionally, a flip-flop 412 is provided to compensate for any delay in divider output signal 410 (e.g., gate delay at a previous stage of the circuit) by realigning divider output signal 410 with clock signal 430. According to some embodiments, fractional pulse width adjuster 400 may selectively be used to lengthen the pulse width of divider output signal 410 by half of a clock cycle.

A flip-flop 440 generates a delay signal 442 that is offset from divider output signal 410 by half of a dock cycle. As depicted in FIG. 4, flip-flop 440 is configured as a D flip flop that receives divider output signal 410 at the D input node and an inverted version of clock signal 430 at the clock input node and outputs delay signal 442 at the Q output node. According to some embodiments, other types of flip-flops and/or other circuit topologies may be used to achieve similar or the same delay behavior. As depicted in FIG. 4, flip-flop 440 generates a delay signal 442 with a fixed (half clock cycle) delay relative to divider output signal 410. However, it is to be understood that in various embodiments the delay may be adjustable and/or may be fixed as a fraction other than half of a clock cycle.

An OR gate 450 applies a Boolean OR operation to divider output signal 410 and delay signal 442 to generate an extended-pulse signal 452. Because delay signal 442 is a delayed version of divider output signal 410, the OR operation causes extended-pulse signal 452 to have a pulse width that is greater than the pulse width of divider output signal 410 by the amount of the delay (e.g., half of a clock cycle). According to some embodiments, one or more other Boolean operations (e.g., AND, XOR, NAND, NOR, and/or the like) may be performed in addition to and/or instead of the OR operation. For example, performing an AND operation causes the pulse width of divider output signal 410 to be decreased by the amount of the delay (e.g., half of a clock cycle).

A multiplexer 460 couples one of divider output signal 410 and extended-pulse signal 452 to output signal 420. Multiplexer 460 is controlled by a Boolean enable signal 462. According to some embodiments consistent with FIG. 2, enable signal 462 may correspond to adjuster control signal 213. When enable signal 462 is high, output signal 420 corresponds to extended-pulse signal 452. When enable signal 462 is low, output signal 420 corresponds to divider output signal 410. According to some embodiments, multiplexer 460 may select output signal 420 from among more than two inputs. For example, multiplexer 460 may select among an original signal (e.g., divider output signal 410), one or more signals having a wider pulse width than the original signal by various fractions of a clock cycle (e.g., extended-pulse signal 452), and/or one or more signals having a narrower pulse width than the original signal by various fractions of a clock cycle.

Figure 5:
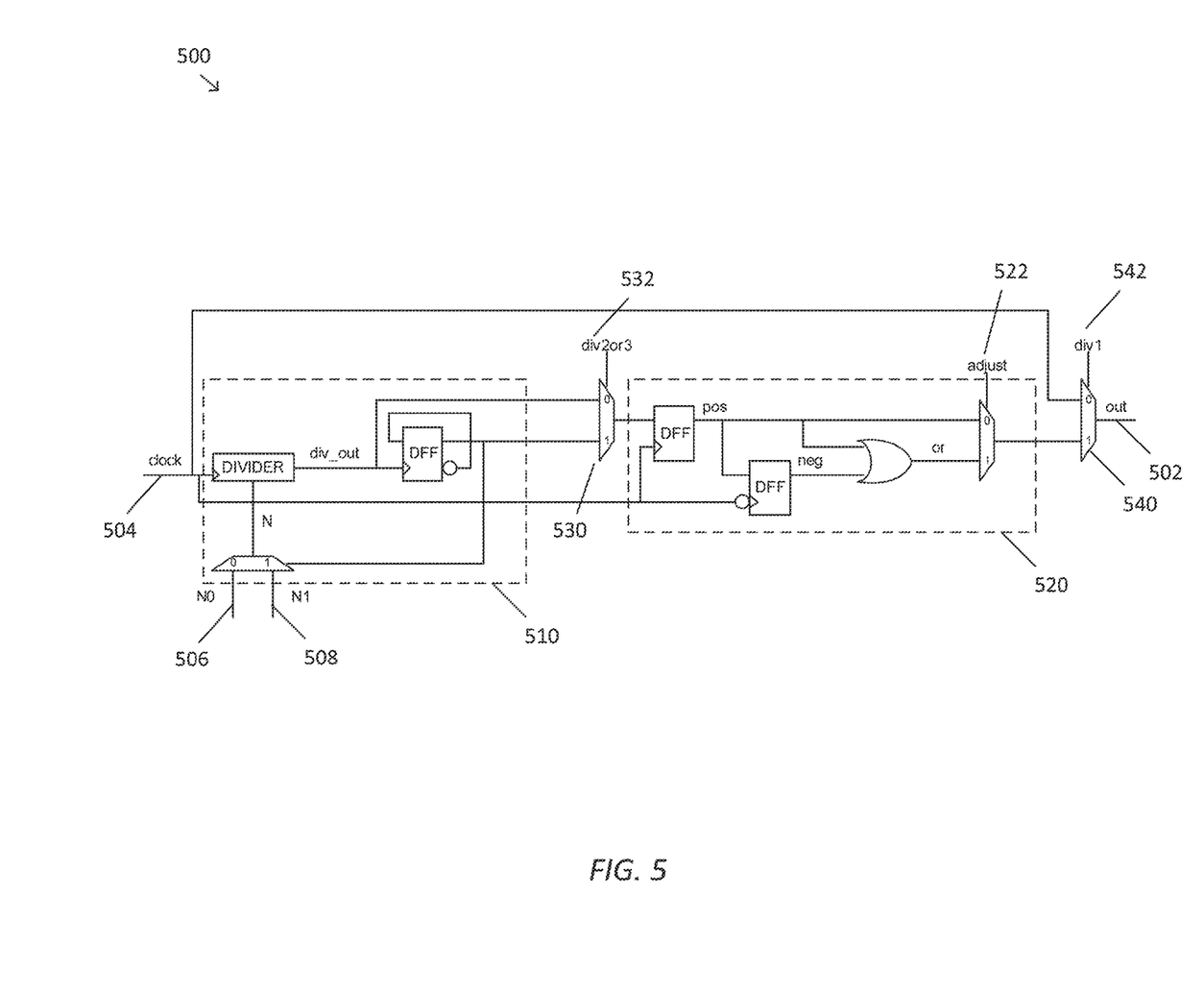
FIG. 5 is a simplified diagram of a frequency divider circuit according to some embodiments.

FIG. 5 is a simplified diagram of a frequency divider circuit 500 according to some embodiments. Frequency divider circuit 500 generates an output signal 502 based on a dock signal 504 and one or more control signals including a first divisor 506 (N0) and a second divisor 508 (N1). According to some embodiments consistent with FIGS. 1-4, frequency divider circuit 500 may be used to implement frequency divider 110 of encoder 100 and/or frequency divider 200. Consistent with such embodiments, frequency divider circuit 500 may include a split-divisor frequency divider subcircuit 510 and a fractional pulse width adjuster subcircuit 520 that generally correspond to instances of split-divisor frequency divider 300 and fractional pulse width adjuster 400, respectively. Fractional pulse width adjuster subcircuit 520 is controlled by a Boolean enable disable signal 522 (labeled adjust).

A pair of multiplexers 530 and 540 provide optional high frequency bypass capabilities to frequency divider 500 and may generally correspond to high frequency bypass module 260 of frequency divider 200. Multiplexer 530 optionally selects an untoggled output signal from split-divisor frequency divider subcircuit 510 based on a bypass control signal 532 (labeled 'div2or3'). For example, multiplexor 530 may be enabled when the values of N0 and N1 are each set to 2 or 3, thereby setting the frequency of output signal 502 to ½ or ⅓ times the clock frequency, respectively. Similarly, multiplexer 540 optionally passes clock signal 504 directly to the output signal based on a bypass control signal 542 (labeled 'div1'). For example, multiplexor 540 may be enabled to set the frequency of output signal 532 equal to the frequency of clock signal 504.

According to some embodiments, frequency divider circuit 500 may be used to encode information into output signal 504 based on the state of one or more control signals including N0, N1, div2or3, adjust, and/or div1. For example, the information to be encoded may include a symbol or a sequence of symbols. Based on the symbol or sequence of symbols, a processor, such as processor 120, may dynamically set the state of the one or more control signals based on TABLE 1 below. According to some embodiments, TABLE 1 may be used to populate a look-up table of the processor, such as look-up table 122. TABLE 1 corresponds to a fixed-duty-cycle mode of operation of frequency divider circuit 500. As illustrated in TABLE 1, the duty cycle of output signal 502 remains fixed (e.g., at 50% and/or another fixed value) while the frequency (i.e., the divisor) varies depending on the symbol to be encoded.

TABLE 1

| Symbol | Divisor | Duty Cycle | N0 | N1 | div2or3 | adjust | div1 |
|---|---|---|---|---|---|---|---|
| 'A' | 1 | 50% | X | X | X | X | 1 |
| 'B' | 2 | 50% | 2 | 2 | 1 | 0 | 0 |
| 'C' | 3 | 50% | 3 | 3 | 1 | 1 | 0 |
| 'D' | 4 | 50% | 2 | 2 | 0 | 0 | 0 |
| 'E' | 5 | 50% | 2 | 3 | 0 | 1 | 0 |
| 'F' | 6 | 50% | 3 | 3 | 0 | 0 | 0 |
| 'G' | 7 | 50% | 3 | 4 | 0 | 1 | 0 |

Alternately or additionally, frequency divider circuit 500 may be operated in a fixed-frequency mode of operation. In the fixed-frequency mode of operation, the divisor remains fixed while the duty cycle of output signal 502 varies depending on the symbol to be encoded, as illustrated in TABLE 2 below.

TABLE 2

| Symbol | Divisor | Duty Cycle | N0 | N1 | div2or3 | adjust | div1 |
|---|---|---|---|---|---|---|---|
| 'A' | 10 | 20% | 2 | 8 | 0 | 0 | 0 |
| 'B' | 10 | 25% | 2 | 8 | 0 | 1 | 0 |
| 'C' | 10 | 30% | 3 | 7 | 0 | 0 | 0 |
| 'D' | 10 | 35% | 3 | 7 | 0 | 1 | 0 |
| 'E' | 10 | 40% | 4 | 6 | 0 | 0 | 0 |
| 'F' | 10 | 45% | 4 | 6 | 0 | 1 | 0 |
| 'G' | 10 | 50% | 5 | 5 | 0 | 0 | 0 |

According to some embodiments, frequency divider circuit 500 may be operated in a hybrid mode of operation, in which both the frequency and duty cycle of output signal 502 vary depending on the symbol to be encoded.

Figure 6:
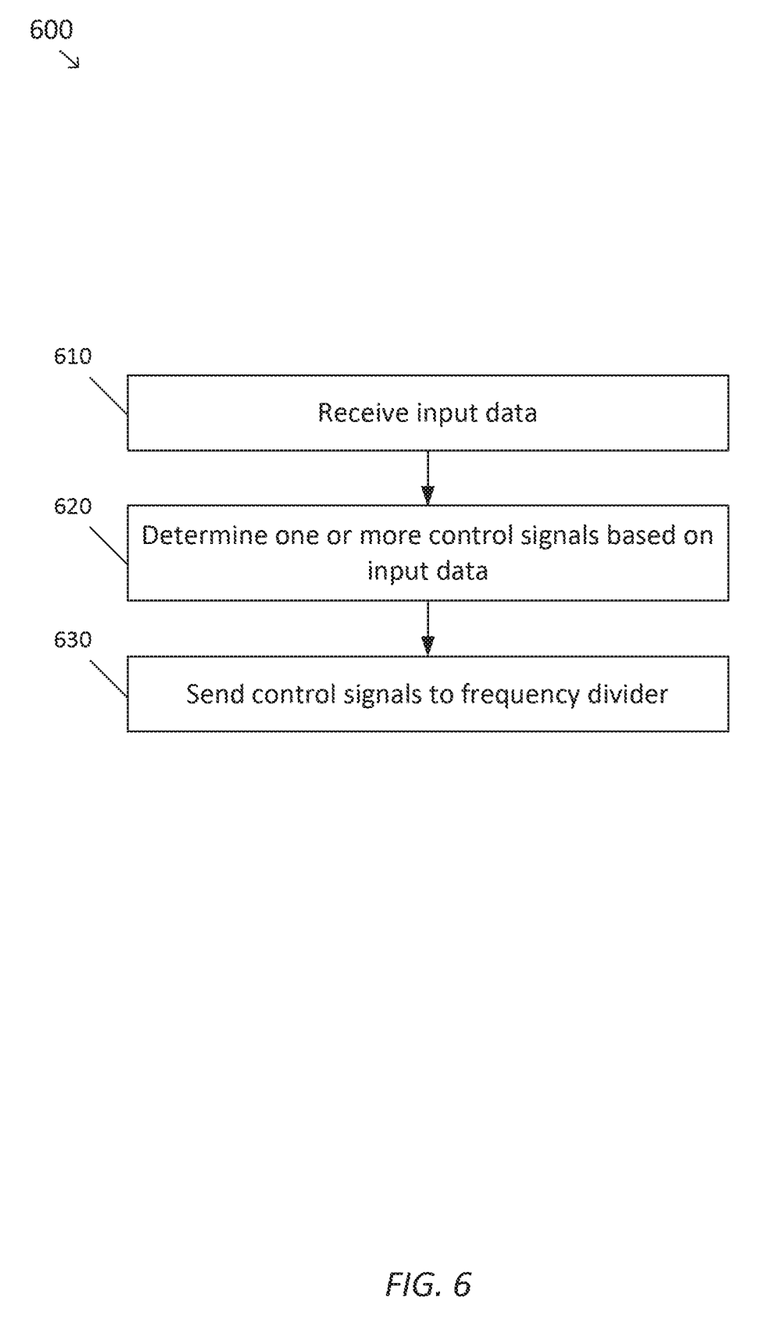
FIG. 6 is a simplified diagram of a method for converting input data into control signals according to some embodiments.

FIG. 6 is a simplified diagram of a method 600 for converting input data into control signals according to some embodiments. According to some embodiments consistent with FIGS. 1-5, method 600 may be carried out by a processor, such as processor 120, that is communicatively coupled to a frequency divider, such as frequency divider 110.

At a process 610, input data, such as input data 102, is received. The input data may include an analog and/or digital representation of virtually any type of data. For example, the input data may include alphanumeric data, binary data, image data, video data, audio data, control data, and/or the like. According to some embodiments, the input data may be represented as a symbol and/or a sequence or stream of symbols.

At a process 620, one or more control signals are determined based on the input data. The one or more control signals are used to determine a frequency and duty cycle of an output signal of the frequency divider. According to some embodiments, the one or more control signals may be determined using a look-up table, such as look-up table 122, and/or any other type of data structure that stores a mapping between symbols and control signals. According to some embodiments, the one or more control signals may be determined by other means, such as an algorithm for mapping symbols to control signals without using a look-up table. According to some embodiments, the one or more control signals may include a first divisor N0, such as first divisor 211, and a second divisor N1, and second divisor 212. N0 and N1 may be integer values used to determine the frequency and/or duty cycle of an output signal. According to some embodiments, the one or more control signals may include an adjuster control signal, such as adjuster control signal 213, used to determine a fractional pulse width adjustment of the output signal. According to some embodiments, the one or more control signals may include one or more bypass control signals, such as bypass control signal 214, used to determine whether one or more stages of the frequency divider should be bypassed.

According to some embodiments, the values of the one or more control signals determined at process 620 may depend on an operating mode. For example, in a fixed-duty-cycle mode, the one or more control signals are selected to maintain a fixed duty cycle while varying the frequency of the output signal based on the input data. In the fixed-duty-cycle mode, the adjuster control signal may be high when the sum of N0 and N1 is odd and low when the sum of N0 and N1 is even. In a fixed-frequency mode, the one or more control signals are selected to maintain a fixed frequency while varying the duty cycle of the output signal based on die input data. In the fixed-frequency mode, the sum of N0 and N1 may be a fixed value, while the ratio N0:N1 varies to achieve a desired duty cycle. In a hybrid mode, both the duty cycle and frequency of the output signal may vary based on the input data.

At a process 630, the one or more control signals are sent to the frequency divider. The one or more control signals may be sent in any suitable format. For example, N0 and N1 may be sent as digital integer values. The adjuster control signal may be a Boolean enable/disable signal, a numerical representation of a desired fractional pulse width adjustment, and/or the like. The bypass control signals may include one or more Boolean enable/disable signals.

Figure 7:
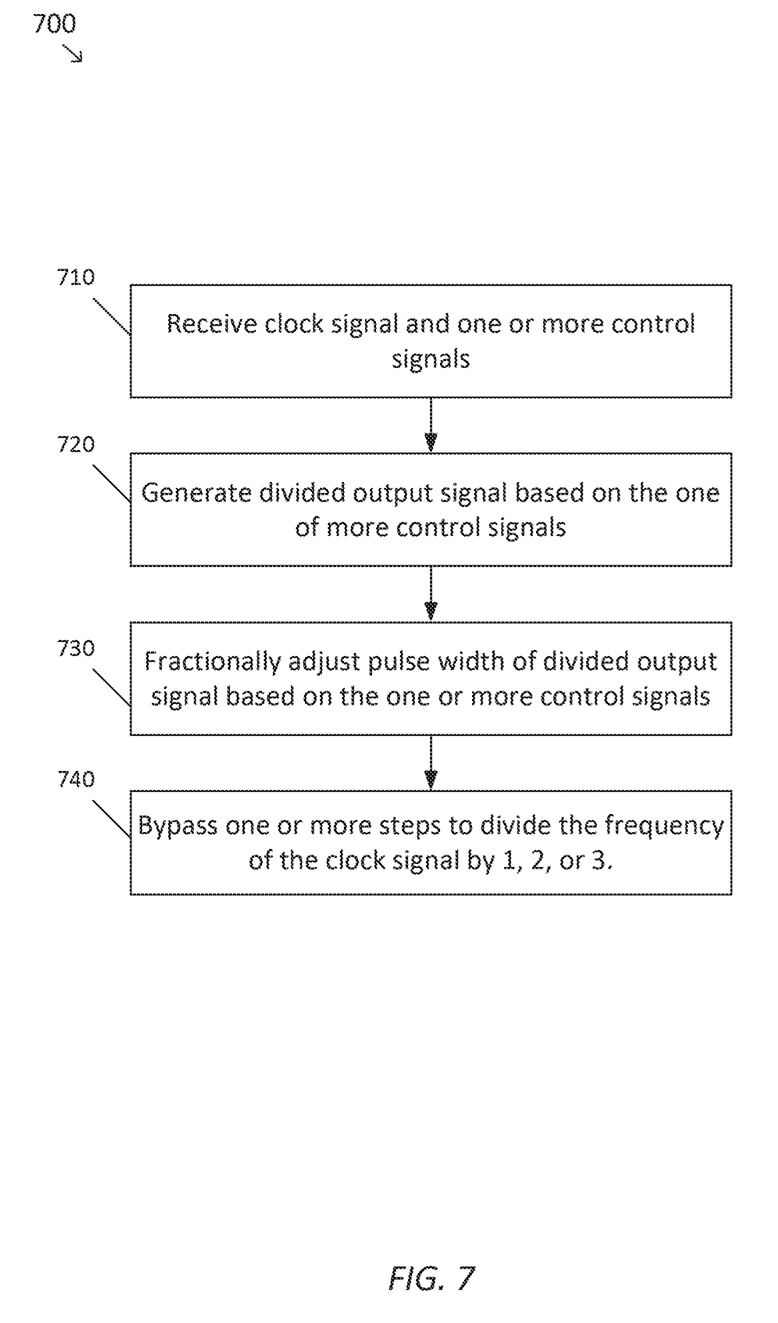
FIG. 7 is a simplified diagram of a method 700 for dividing the frequency of a clock signal according to some embodiments.

FIG. 7 is a simplified diagram of a method 700 for dividing the frequency of a clock signal according to some embodiments. According to some embodiments consistent with FIGS. 1-6, method 700 may be performed by a frequency divider, such as frequency divider 110, based on one or more control signals, such as control signals 112.

At a process 710, a clock signal, such as clock signal 106, and one or more control signals are received. According to some embodiments consistent with FIG. 6, the received control signals may include the one or more control signals sent at process 630. In some examples, the clock signal may be a square waveform with a fixed amplitude and frequency and a 50% duty cycle. For example, the clock signal may be generated using an oscillator and/or a timer circuit.

At a process 720, a divided output signal is generated based on the one or more control signals. The divided output signal has a selectable frequency that is an integer fraction of the frequency of the clock signal and a selectable duty cycle. The selectable frequency and duty cycle are selected based on the one or more control signals. For example, when the control signals include first and second divisors N0 an N1, the frequency of the divided output signal may be 1/N times the clock frequency and the duty cycle may be N0/N or N1/N, where N is the sum of N0 and N1. According to some embodiments, N0 and N1 are each greater than or equal than 2, in which case the minimum value of N is 4. That is, the maximum frequency of the divided output signal may be ¼ times the frequency of the clock signal.

At a process 730, the pulse width of the divided output signal is fractionally adjusted based on the one or more control signals. For example, the control signals may include an adjuster control signal that enables or disables a fractional pulse width adjuster, such as fractional pulse width adjuster 250. According to some embodiments, the pulse width of the divided output signal is constrained to integer multiples of clock cycles. In order to expand the range of duty cycles that can be achieved using method 700, the pulse width of the divided output signal may be fractionally adjusted. For example, the pulse width may be lengthened or shortened by half of a clock cycle. One advantage of fractionally adjusting the pulse width is the ability to achieve a 50% duty cycle even when the sum of N0 and N1 is an odd number.

At a process 740, one or more of steps of method 700 are bypassed in order to divide the frequency of the clock signal by 1, 2, or 3 based on the one or more control signals. For example, the control signals may include one or more bypass control signals that enable or disable one or more corresponding bypass switches, selectors, multiplexors, and/or the like. For example, to divide the clock signal by 1, each of steps 720 and 730 may be bypassed and the clock signal may be passed directly to the output signal using a bypass circuit. To divide the clock signal by 2 or 3, an intermediate signal generated during process 720, such as untoggled output signal 244, may be selected rather than the final divided output signal generated during process 720.

Some examples of processors, such as encoder 100 and/or processor 120 may include non-transient, tangible, machine readable media that include executable code that when run by one or more processors (e.g., processor 120) may cause the one or more processors to perform the processes of methods 600 and/or 700. Some common forms of machine readable media that may include the processes of methods 600 and/or 700 are, for example, floppy disk, flexible disk, hard disk, magnetic tape, any other magnetic medium, CD-ROM, any other optical medium, punch cards, paper rape, any other physical medium with patterns of holes, RAM, PROM, EPROM, FLASH-EPROM, any other memory chip or cartridge, and/or any other medium from which a processor or computer is adapted to read.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A frequency divider system comprising:
a split-divisor frequency divider module that receives a clock signal and generates an output signal based on a first divisor and a second divisor, the clock signal and output signal each having rectangular waveforms characterized by a respective frequency and pulse width;
wherein:
the frequency of the output signal is a selectable integer fraction of the frequency of the clock signal, the frequency of the output signal being selected based on a sum of the first and second divisors;
the pulse width of the output signal is a selectable integer number of clock cycles of the clock signal, the pulse width of the output signal being selected based on at least one of the first divisor and the second divisor;
a fractional pulse width adjuster module, the fractional pulse width adjuster module is configured to adjust the pulse width of a split-divisor frequency divider module output signal by a fraction of an input clock cycle; and
a high frequency bypass module, the high frequency bypass module configured to bypass one or more stages of the frequency divider,
wherein the split-divisor frequency divider module comprises:
a selector module configured to select between the first and second divisors based on a control input, the control input being coupled to the output signal of the split-divisor frequency divider module;
an integer divider configured to generate pulses every N2 clock cycles, where N2 is set to one of the first and second divisors selected by the selector module; and
a toggle module configured to toggle the output signal at each low-to-high or high-to-low transition of the pulses generated by the integer divider.

2. A frequency divider system comprising:
a split-divisor frequency divider module that receives a clock signal and generates an output signal based on a first divisor and a second divisor, the clock signal and output signal each having rectangular waveforms characterized by a respective selectable frequency and a selectable pulse width;
wherein:
the frequency of the output signal is a selectable integer fraction of the frequency of the clock signal, the frequency of the output signal being selected based on a sum of the first and second divisors;
the pulse width of the output signal is a selectable integer number of clock cycles of the clock signal, the pulse width of the output signal being selected based on at least one of the first divisor and the second divisor; and
wherein the split-divisor frequency divider module comprises:
a selector module configured to select between the first and second divisors based on a control input, the control input being coupled to the output signal of the split-divisor frequency divider module;
an integer divider configured to generate pulses every N2 clock cycles, where N2 is set to one of the first and second divisors selected by the selector module; and
a toggle module configured to toggle the output signal at each low-to-high or high-to-low transition of the pulses generated by the integer divider.

3. The frequency divider system of claim 2, wherein the frequency of the output signal is 1/N times the frequency of the clock signal, where N is the sum of the first and second divisors.

4. The frequency divider system of claim 2, wherein the pulse width of the output signal is N0 or N1 clock cycles, where N0 and N1 are the first and second divisors, respectively.

5. The frequency divider system of claim 2, wherein the selector module includes a multiplexer.

6. The frequency divider system of claim 2, wherein the toggle module includes a flip-flop.

7. The frequency divider system of claim 2, further comprising a fractional pulse width adjuster module that adjusts the pulse width of the output signal by a fraction of the clock cycle of the clock signal based on an adjuster control signal.

8. The frequency divider system of claim 7, wherein the fractional pulse width adjuster module lengthens or shortens the pulse width of the output signal by half of the clock cycle of the clock signal.

9. The frequency divider system of claim 8, wherein the adjuster control signal is a Boolean enable/disable signal that is high when the sum of the first and second divisors is odd and low when the sum of the first and second divisors is even.

10. The frequency divider system of claim 8, wherein the fractional pulse width adjuster module comprises:
a flip-flop circuit that receives an inverted version of the clock signal at a clock input node and the output signal of the split-divisor frequency divider module at a D input node; and
a Boolean logic gate that performs a logic operation based on the output signal of the split-divisor frequency divider module and a second output signal of the flip-flop circuit.

11. The frequency divider system of claim 10, wherein the logic operation is selected from a group consisting of: AND, OR, NAND, and NOR.

12. The frequency divider system of claim 2, further comprising a high frequency bypass module that bypasses one or more portions of the frequency divider system to increase the frequency of the output signal above a maximum frequency of the split-divisor frequency divider.

13. The frequency divider system of claim 12, wherein the maximum frequency of the split-divisor frequency divider is ¼ times the frequency of the clock signal.

* * * * *